US009301402B2

(12) United States Patent
Herman et al.

(10) Patent No.: US 9,301,402 B2
(45) Date of Patent: Mar. 29, 2016

(54) HIGH DENSITY SERVER STORAGE UNIT

(71) Applicant: Skyera, LLC, San Jose, CA (US)

(72) Inventors: Pinchas Herman, Sunnyvale, CA (US);
William Radke, Los Gatos, CA (US);
Radoslav Danilak, Cupertino, CA (US)

(73) Assignee: Skyera, LLC, San Jose, CA (US)

( * ) Notice: Subject to any disclaimer, the term of this patent is extended or adjusted under 35 U.S.C. 154(b) by 78 days.

(21) Appl. No.: 14/212,941

(22) Filed: Mar. 14, 2014

(65) Prior Publication Data

US 2014/0268536 A1    Sep. 18, 2014

Related U.S. Application Data

(60) Provisional application No. 61/798,754, filed on Mar. 15, 2013.

(51) Int. Cl.
*H05K 1/14* (2006.01)
*H05K 3/30* (2006.01)
*H05K 7/14* (2006.01)

(52) U.S. Cl.
CPC ............... *H05K 3/30* (2013.01); *H05K 7/1487* (2013.01); *Y10T 29/4913* (2015.01)

(58) Field of Classification Search
USPC ......... 361/688, 728–730, 736, 752, 796, 800, 361/679.46, 679.48, 679.5, 679.51, 361/692–697
See application file for complete search history.

(56) References Cited

U.S. PATENT DOCUMENTS

| | | | | |
|---|---|---|---|---|
| 6,678,157 | B1* | 1/2004 | Bestwick | 361/695 |
| 7,155,627 | B2* | 12/2006 | Matsui | 713/401 |
| 7,391,618 | B2* | 6/2008 | Fujiya et al. | 361/727 |
| 7,492,597 | B2* | 2/2009 | Huang | 361/719 |
| 7,595,982 | B2* | 9/2009 | Ong et al. | 361/679.49 |
| 7,933,125 | B2* | 4/2011 | Wei et al. | 361/699 |
| 8,089,770 | B2* | 1/2012 | Olesiewicz et al. | 361/752 |
| 8,373,986 | B2* | 2/2013 | Sun | 361/695 |
| 8,379,391 | B2* | 2/2013 | Amidi et al. | 361/728 |
| 8,659,897 | B2* | 2/2014 | Meijer et al. | 361/699 |
| 2006/0198104 | A1* | 9/2006 | Chang et al. | 361/695 |
| 2008/0141100 | A1* | 6/2008 | Kang et al. | 714/773 |
| 2009/0097200 | A1* | 4/2009 | Sharma et al. | 361/688 |
| 2013/0027870 | A1* | 1/2013 | Goldr an et al. | 361/679.32 |
| 2014/0063721 | A1* | 3/2014 | Herman et al. | 361/679.31 |

* cited by examiner

*Primary Examiner* — Hung S Bui
(74) *Attorney, Agent, or Firm* — Wilmer Cutler Pickering Hale and Dorr LLP

(57) ABSTRACT

A rack mountable 1U storage unit includes a plurality of memory modules arranged in two groups. The storage unit also has control circuitry. The memory modules have a dedicated exhaust channel to draw heat away from the memory modules. The exhaust channel for the memory modules is disposed over and is physically separated from the exhaust channel for the control circuitry. The storage unit can accommodate up to 42 memory modules due to a unique method of placing the individual memory modules.

18 Claims, 10 Drawing Sheets

HIGH DENSITY SERVER STORAGE UNIT

CROSS-REFERENCES TO RELATED APPLICATIONS

This Application claims priority to and the benefit of U.S. Provisional Application No. 61/798,754, filed Mar. 15, 2013 and entitled "HIGH DENSITY SERVER STORAGE UNIT," the contents of which are incorporated by reference herein in its entirety for all purposes.

BACKGROUND

Conventional server storage units include hard-drive based or similar storage devices. While hard-drives are cheap, the physical size of the hard-drives and the limitation of the storage capacity of each hard drive make it difficult to achieve high-density storage capacity in a standard 1U chassis.

Servers are typically arranged in one or more server racks. Each server rack can hold multiple pieces of rack-mountable units that are designed to fit in the server rack. Each rack-mountable unit is generally one of several standard dimensions measured in terms or a 'rack unit.' A rack unit, U or RU is a unit of measure used to describe the height of equipment intended for mounting in a 19-inch rack or a 23-inch rack. The 19-inch (48.26 cm) or 23-inch (58.42 cm) dimension refers to the width of the equipment-mounting frame in the rack, i.e., the width of the equipment that can be mounted inside the rack. One rack unit (1U) is 1.75 inches (44.45 mm) high. The size of a piece of rack-mounted equipment is frequently described as a number in "U". For example, one rack unit is often referred to as "1U", 2 rack units as "2U" and so on. Typical dimensions for a 1U unit are about 19 inches (W)× 1.75 inches (H)×17.7 inches-21.5 inches (D).

Since the dimensions of a 1U rack-mountable chassis is fixed, depending on the physical dimensions of a hard-drive, there is only a certain memory capacity that can be packed into a traditional hard-drive based 1U storage unit. Even though hard-drives have been getting smaller in size, the inherent disadvantage of a hard-drive is its size compared to other types of memory such as Flash and DRAM.

There is a need in the industry to provide very high capacity rack-mounted storage units that can overcome the size and capacity issues of a traditional hard-drive based system.

SUMMARY

Embodiments of the present invention is generally related to rack mountable storage units. Specifically, some embodiments of the present invention provide a 1U rack mountable storage unit that includes up to 42 memory modules and separate dedicated exhaust channels for the memory modules and for the associated control circuitry.

An embodiment of the present invention provides a storage unit. The storage unit includes an enclosure that has a front face, a back face opposing the front face, and two side faces. The enclosure has dimensions of 19 inches wide, 1.75 inches height, and between 17.7 and 21.5 inches depth. The storage unit also includes a first section that includes a first plurality of memory modules and a second section that includes a second plurality of memory modules. The first and the second sections abut the back face. The storage unit also includes a third section including control circuitry. The third section abuts the front face. The storage unit further includes a panel overlying the third section and a plurality of fans attached to the back face and operable to direct airflow towards the front face. The front face of the storage unit has a first plurality of openings disposed in an upper section of the front face and a second plurality of opening disposed directly below the first plurality of openings. The storage unit further includes a first exhaust channel. The first exhaust channel is thermally coupled to the first and the second plurality of memory modules and extends towards the front face over the panel and ends at the first plurality of openings. The first exhaust channel is configured to direct flow of hot air from the first plurality of memory modules to the front face without allowing the hot air to come in contact with the control circuitry. The storage unit further includes a second exhaust channel thermally coupled to the third section and extending towards the front face underneath the panel and ending at the second plurality of openings.

In some embodiments, each of the first and the second plurality of memory modules includes 21 memory modules. In some embodiments, each of the memory modules comprises a printed circuit board (PCB) including one or more memory devices and a stiffener member attached to the PCB, wherein a width of the stiffener member is between 7 mm and 8 mm. In other embodiments, the first exhaust channel includes the panel that provides a physical barrier between the first exhaust channel and the third section. The storage unit may include one or more memory devices which are multi-level cell (MLC) non-volatile memory devices.

Another embodiment of the present invention provides a storage unit that includes a first plurality of memory modules disposed side-by-side to each other and a second plurality of memory modules disposed side-by-side to each other. Each of the first and second plurality of memory modules includes 21 memory modules and each memory module further comprises a memory board including a plurality of memory devices and a stiffener attached to the memory board. The stiffener has a width of between 7 mm and 8 mm and a pitch between two immediately adjacent stiffeners is between 7.5 mm and 8.5 mm.

In some embodiments, the storage unit may further include an enclosure that conforms with 1U specification for a rack mountable unit. In some embodiments, the memory module includes a pair of anchor points for connection with the stiffener. The storage unit may further include control circuitry for controlling the memory modules. The storage unit may also include a first exhaust channel configured to direct hot air from the first and the second plurality of memory modules and a second exhaust channel configured to carry hot air from the control circuitry. In other embodiments, the second exhaust channel is disposed directly below the first exhaust channel.

The following detailed description, together with the accompanying drawings will provide a better understanding of the nature and advantages of the present invention.

DETAILED DESCRIPTION

Embodiments of the present invention generally relate to a rack-mountable storage unit. Specifically, embodiments of the present invention provide a 1U rack-mountable storage unit that includes one or more memory modules and associated control electronics. The memory modules are arranged within the 1U enclosure to balance (e.g., maximize) space utilization and storage capacity (e.g., maximize). In some embodiments, each 1U storage unit can provide between 4 and 10 Terabytes of memory. Embodiments of the present invention use flash memory devices in the storage modules. In a particular embodiment, the storage modules include Multi-Level Cell (MLC) type flash memory devices.

Figure 1:
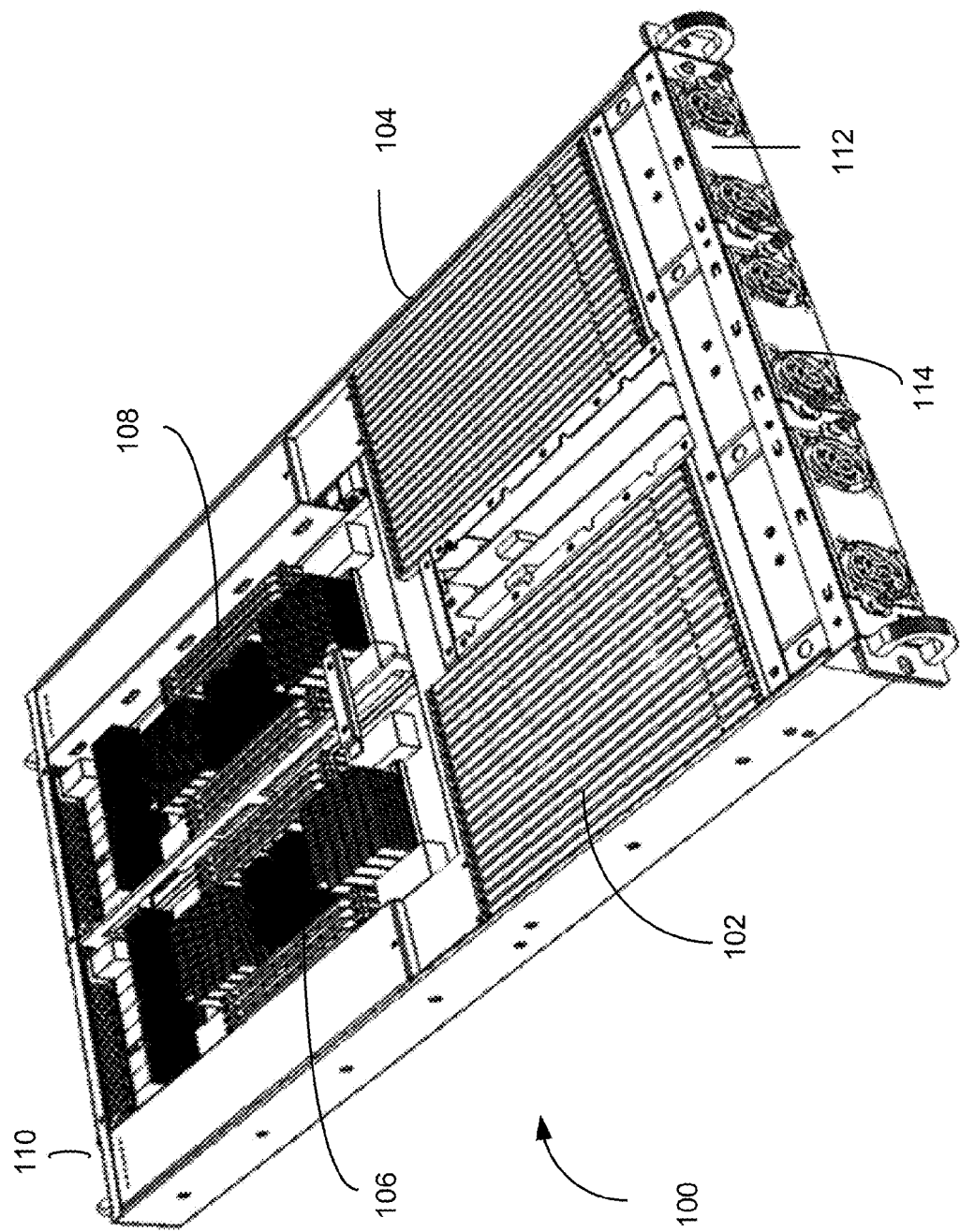
FIG. 1 illustrates a high-level diagram of a server storage unit according to an embodiment of the present invention.

FIG. 1 illustrates a high-level diagram of a server storage unit 100 according to an embodiment of the present invention. Storage unit 100 includes at least four distinct sections in which components are arranged. In this example, sections 102 and 104 include storage modules arranged side-by-side in a vertical orientation. Sections 106 and 108 include the control electronics that is used to control and manage the operation of storage unit 100. In some embodiments, sections 102 and 104 are maintained at an elevated temperature of about 60° C. by using active heating techniques. In further embodiments, sections 106 and 108 can be maintained at relatively lower temperatures, for example, since these sections include the control circuitry including processors, peripheral IC's, and other electrical components. Server unit 100 has a front face 110 and an opposing back face 112. One or more fans 114 are mounted to back face 112 and blow air towards front face 110. Front face 110 has several openings that allow air to escape through them carrying the heat out of storage unit 100. In operation, fans 114 direct airflow from back face 112 towards front face 110, from where it is exhausted out.

Thermal Management

Since sections 102 and 104 include multiple storage modules and are maintained at a higher temperature, in one aspect, the amount of heat generated in sections 102 and 104 is greater than the amount of heat generated in sections 106 and 108. It can be undesirable to allow the heat generated in sections 102 and 104 to be exhausted through the cooler sections 106 and 108. When sections 106 and 108 include heat-sensitive digital electronic components, allowing these components to be exposed to heat from sections 102 and 104 may have adverse effects on these components. However, since all the fans are located at the back face of unit 100, the air is primarily exhausted out from the front face 110. Embodiments of the present invention provide techniques for exhausting the heat from sections 102 and 104 via the front face 110 without exposing any sensitive components in sections 106 and 108 to the heat.

Figure 2A:
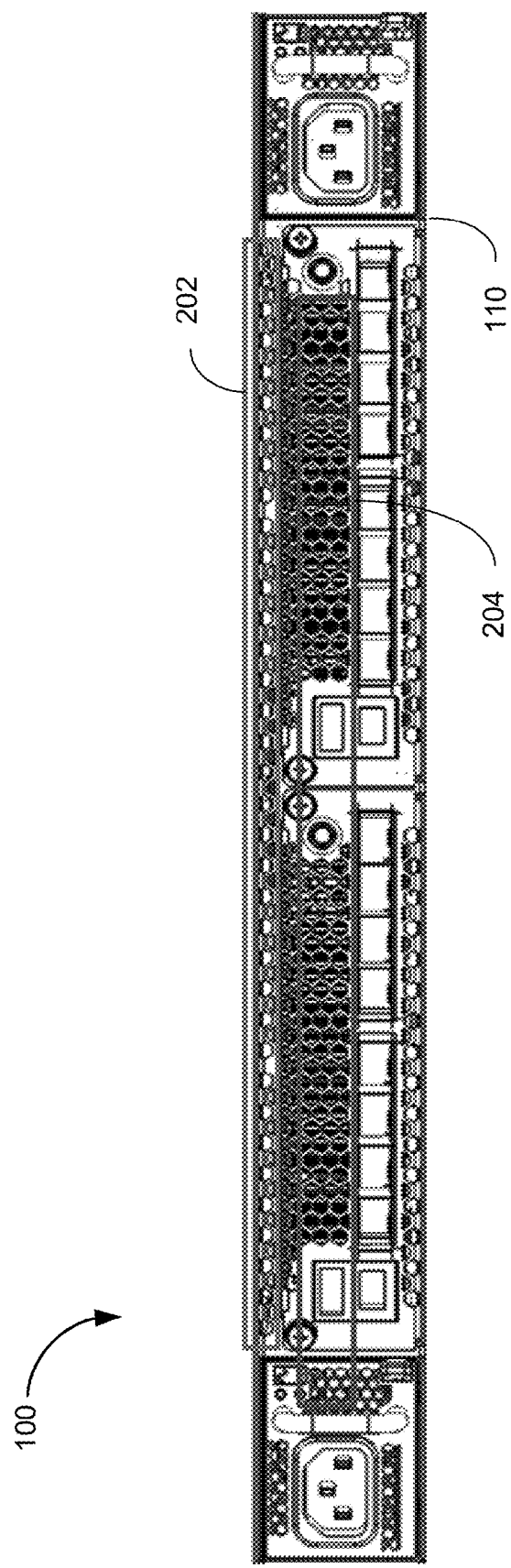
FIG. 2A illustrates a front face of a storage unit showing two different exhaust channels for memory modules and control electronics according to an embodiment of the present invention.
Figure 2B:
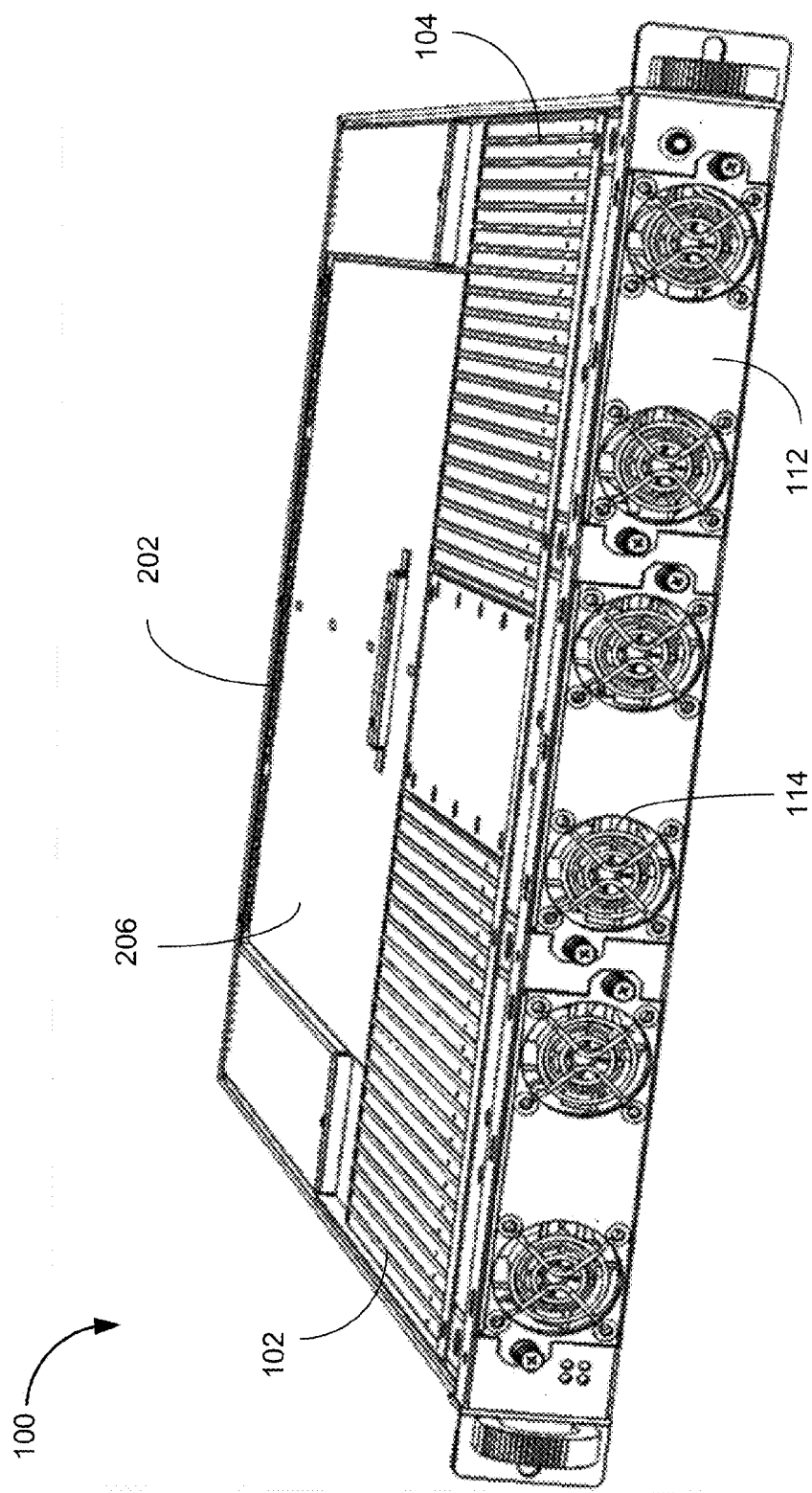
FIG. 2B shows a different view of the storage unit illustrating fans attached to a back face to direct air according to an embodiment of the present invention.

FIG. 2A illustrates front face 110 of storage unit 100 showing the two different exhaust channel openings for the memory modules and the control electronics according to an embodiment of the present invention. As illustrated in FIG. 2, exhaust channel openings 202 are located above exhaust channel openings 204. Exhaust channel openings 202 are used to exhaust heat/hot air from sections 102 and 104 that include the memory modules. Exhaust channel openings 204 are used to exhaust heat/hot air from sections 106 and 108 that house the control electronics. As can be seen, exhaust channel openings 202 are disposed directly above exhaust channel openings 204. FIG. 2B shows a different view of storage unit 100 according to an embodiment of the present invention. As illustrated in FIG. 2B, fans 114 attached to back face 112 of storage unit 100 direct air towards the front face 110. A panel 206 covers sections 106 and 108 that house the control electronics and isolates those sections from the hot air coming from sections 102 and 104. A deflector panel described in FIGS. 3A-3C below deflects the flow of air from memory module sections 102 and 104 over panel 206 and towards exhaust channel openings 202 to be exhausted out through the front face of storage unit 100. Thus, the hot air from sections 102 and 104 is directed above the control sections without the hot air interacting or coming in contact with the components in the control system. Panel 206 presents a physical barrier between the hot air from sections 102 and 104 and the control circuitry.

Figure 3A:
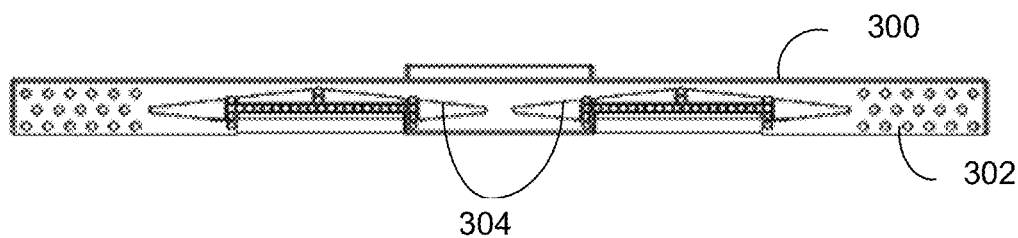
FIGS. 3A, 3B, and 3C illustrate several views of a deflector panel that is used to divert the hot air from the memory module sections of the storage unit to a dedicated exhaust channel according to an embodiment of the present invention.
Figure 3B:
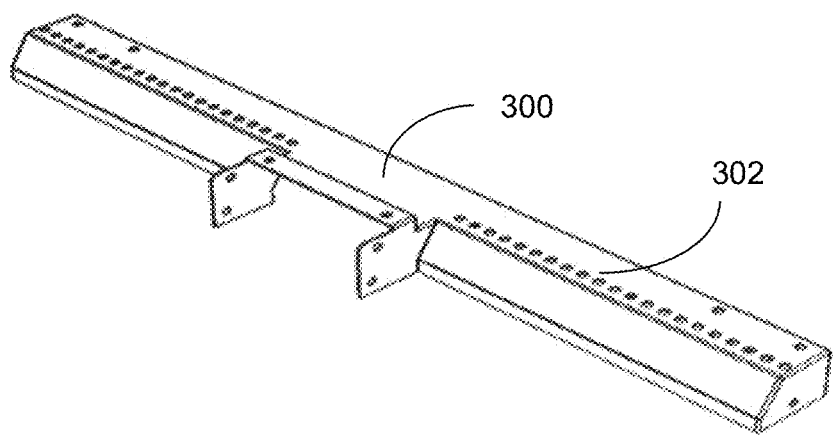
Figure 3C:
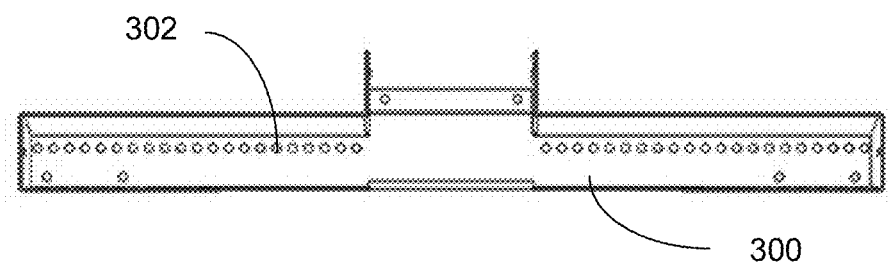

FIGS. 3A-3C illustrate various views of a deflector panel 300 that is used to divert air from the memory modules and direct it over/above panel 206. For example, in FIG. 3A, deflector panel 300 includes two groups of opening 302 disposed towards the two ends of panel 300. Two openings 304 are disposed towards the center of panel 300. The openings 304 divert the air from each of sections 102 and 104 over panel 206 and out through openings 202. Openings 302 are used to direct the airflow to the power supply modules that also exhaust via the front face of storage unit 100.

Figure 4:
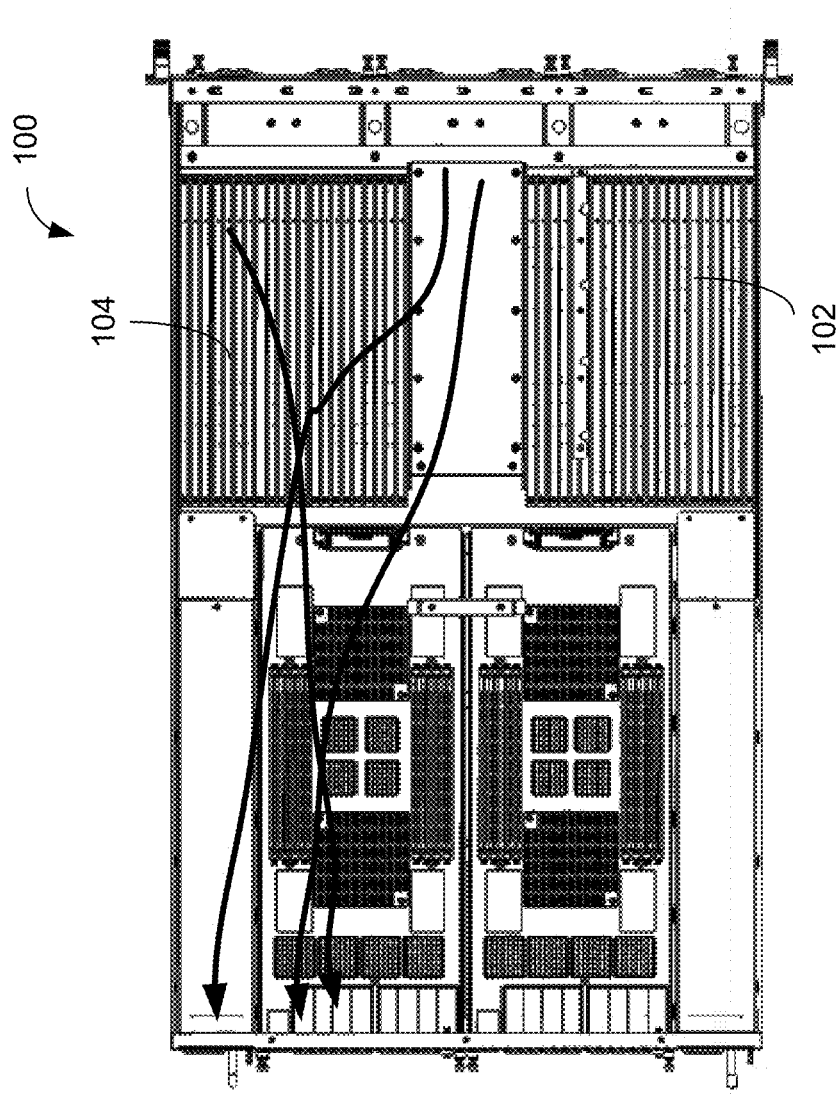
FIG. 4 is a top view of the memory storage unit illustrating the air flow in the memory sections according to an embodiment of the present invention.

FIG. 4 is a top view of storage unit 100 and illustrates the airflow within storage unit 100. FIG. 4 shows a view in which panel 206 described above has been removed to show the relative air flows from sections 102, 104, 106, and 108.

Density Management

As described above, sections 102 and 104 include multiple storage modules. Since the dimensions of storage unit 100 are fixed, the amount of real estate inside unit 100 is also fixed. One of the big challenges is to include sufficient memory in the 1U unit 100 to be usable as a server storage unit. As is well-known, one of the requirements for server storage units is that each storage unit must have high memory capacity. The higher the memory capacity that can be accommodated in a given storage unit, the better the storage unit is for use in enterprise applications. Many of the conventional 1U flash-memory based storage units commercially available today hold 21 or fewer memory modules or PCB's. This inherently limits the amount of memory that can be accommodated in conventional 1U storage units. Examples of a conventional flash memory based 1U storage unit include the RamSan-710 and RamSan-820 by Texas Memory Systems. The amount of individual storage modules that can be accommodated into a 1U storage unit depends on the thickness of each individual storage module PCB, the mounting mechanism used to mount each individual storage module to the 1U chassis, and the effectiveness of thermal dissipation techniques used to exhaust the heat generated by the storage modules. All three factors mentioned above have to be considered in deciding how may memory modules can be safely placed in a 1U rack mountable unit. Further, the memory capacity of each storage module (i.e., PCB) needs to be adjusted based on the factors above.

Embodiments of the present invention provide techniques to fit up to 42 flash memory based modules into a single 1U unit. This represents 2× as many memory modules than any conventional flash memory-based 1U storage unit and thus significantly increases the density of memory modules. Placing up to 42 memory modules in a single 1U unit is not a trivial task and no one in the art has yet been able to achieve such densities. In order to achieve such huge improvement in packing density, embodiments of the present invention utilize novel thermal management scheme as described above. In some embodiments, unique mounting techniques for the individual memory modules are used to minimize space occupied by each memory module.

Figure 5:
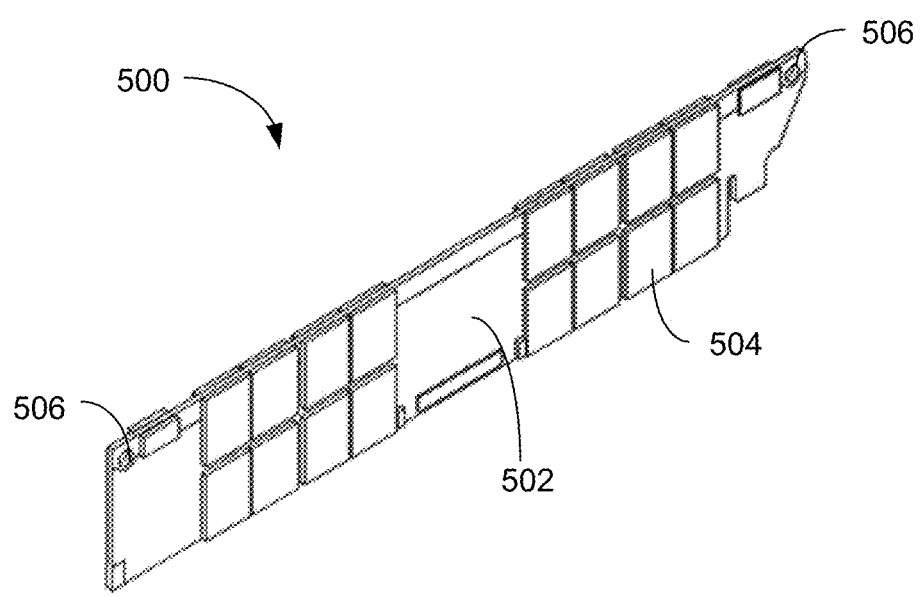
FIG. 5 illustrates a high-level perspective view of an individual memory module according to an embodiment of the present invention.

FIG. 5 illustrates a high-level perspective view of individual memory module 500 according to an embodiment of the present invention. Memory module 500 includes a printed circuit board (PCB) 502 on which are mounted one or more individual memory chips 504, e.g., MLC-based flash memory devices. Anchor points 506 enable the memory module 500 to be attached to a stiffener member (not shown) to enable installation and un-installation of individual memory module 500 into unit 100. PCB 502 may include other components not specifically shown here.

Figure 6:
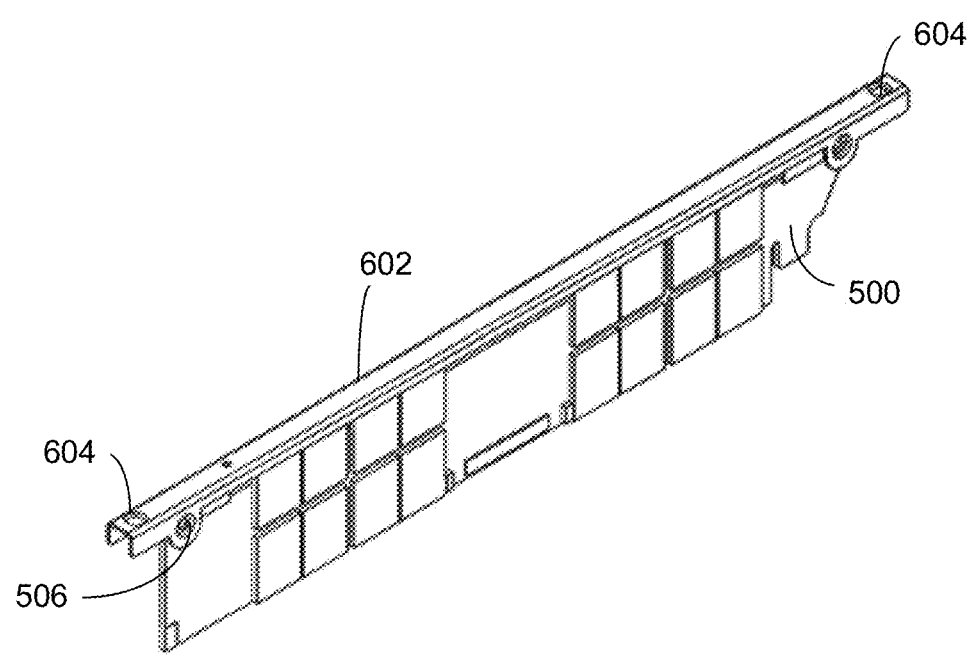
FIG. 6 illustrates a memory module attached to a stiffener member according to an embodiment of the present invention.

FIG. 6 illustrates memory module 500 attached to stiffener member 602 according to an embodiment of the present invention. Stiffener member 602 has two connection points 604 that enable the stiffener to be attached to an anchor plate (not shown) within the memory storage unit 100. In order to enable accommodation of up to 42 such memory modules inside storage unit 100, the need for card guides to install the memory modules is eliminated to reduce the wastage of space. Traditionally, in order to mount a PCB in a chassis, card guides are used to ensure proper placement of PCB's in the chassis. A common example of such a card guide can be found in desktop personal computers that have card guides to accept various types of PCB modules such as, memory cards, graphics cards, etc. However, use of such card guides increases the overall area that each card module occupies. Such a scheme of card placement cannot be used where high density packing is needed. Thus, embodiments of the present invention provide techniques for mounting of individual memory modules without the use of card guides. This enables packing of up to 42 memory modules in a single 1U storage unit, which is not possible with conventional techniques and has not been achieved in the art until now. As illustrated in FIG. 6, each individual memory PCB is attached to stiffener member 602. Stiffener member 602 is used as a card guide for adjacent memory modules.

Figure 7A:
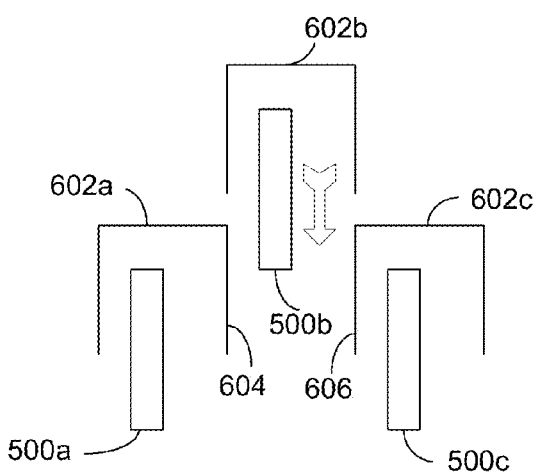
FIGS. 7A and 7B show an illustration of a technique for installing a memory module according to an embodiment of the present invention.
Figure 7B:
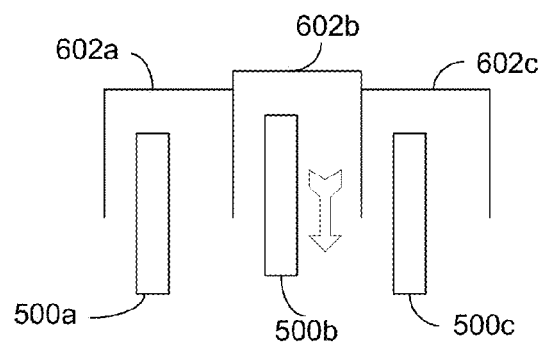

FIGS. 7A and 7B show an illustration of a technique for installing a memory module according to an embodiment of the present invention. Consider that two memory modules 500a and 500c are already installed in storage unit 100. Memory module 500a has an associated stiffener member 602a and memory module 500c has an associated stiffener member 602c. A new memory module 500b having stiffener member 602b is to be installed in between 500a and 500c. Since there is no card guide to install memory module 500b, side 604 of stiffener 602a and side 606 of stiffener 602c are used as a card guide to position memory module 500b in between memory modules 500a and 500c. This allows more memory modules to be packed within a given space and significantly reduces the amount of space occupied by each memory module.

Figure 8A:
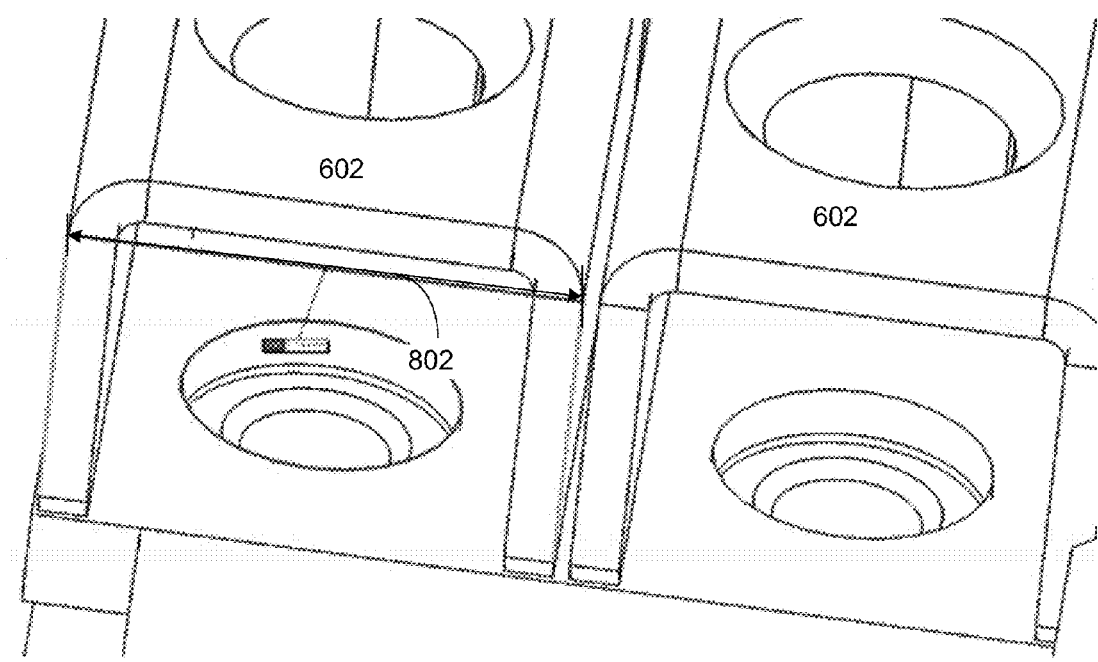
FIGS. 8A and 8B are close-up views of a portion of a memory section of the memory storage unit according to an embodiment of the present invention.
Figure 8B:
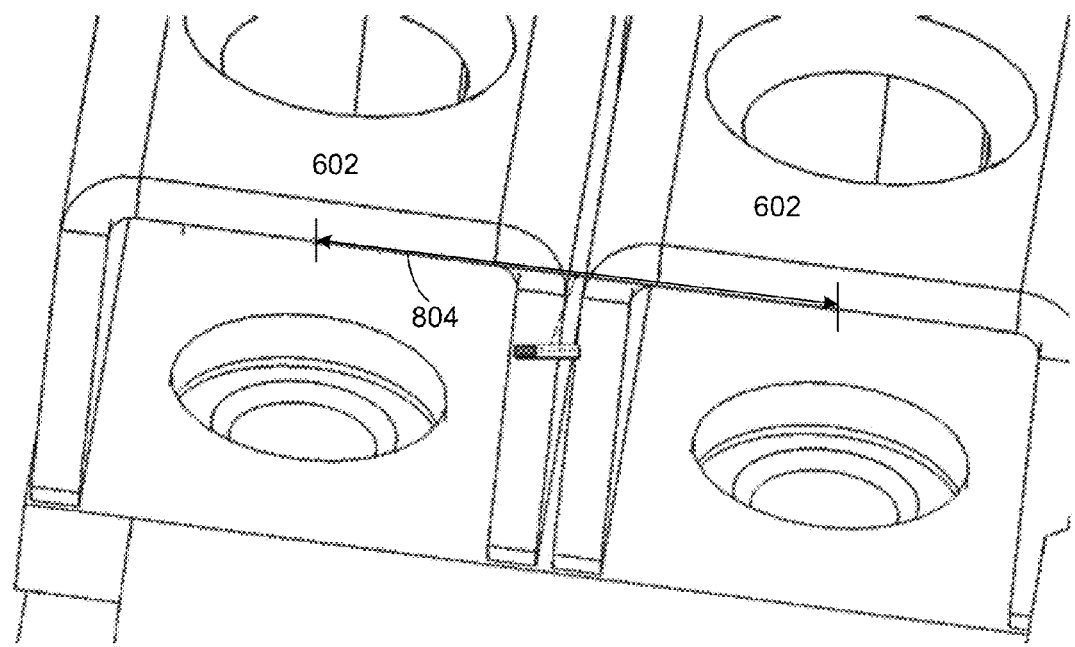

In order to further reduce the space occupied by each memory module, the dimensions of the memory modules and the stiffener are designed to accommodate up to 42 memory modules in a 1U rack mountable storage unit. FIGS. 8A and 8B are close-up views of a portion of either section 102 or 104 according to an embodiment of the present invention. FIG. 8A illustrates two memory modules having stiffener members 602, installed next to each other. A width 802 of each stiffener member 602 is between 5-8 mm. This allows compact packing of several of these memory modules in a given space. FIG. 8B illustrates pitch 804 (i.e., center-to-center distance) between two adjacent memory modules is between 5.5 mm and 6.5 mm.

The techniques described above allow creation of a high-density rack-mountable storage unit, which is otherwise not possible using conventional techniques. Techniques described herein allow packaging of up to 42 memory modules in a standard 1U rack unit. It is to be noted that a 1U rack unit is used herein as an example to illustrate the various embodiments. One skilled in the art will realize that the various techniques described herein can also be applied in storage units that have dimensions different from a standard 1U unit. Thus, the embodiments of the present invention are not limited to a 1U rack mountable storage unit.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A storage unit comprising:
    an enclosure having a front face, a back face opposing the front face, and two side faces, wherein the enclosure has dimensions of 19 inches wide, 1.75 inches height, and between 17.7 and 21.5 inches depth;
    a first section within the enclosure including a first plurality of memory modules;
    a second section within the enclosure including a second plurality of memory modules, wherein the first and the second sections abut the back face;
    a third section including control circuitry, the third section abutting the front face;
    a panel overlying the third section;
    a plurality of fans attached to the back face and operable to direct air flow towards the front face;
    a first plurality of openings disposed in an upper section of the front face;
    a second plurality of opening disposed directly below the first plurality of openings;
    a first exhaust channel, the first exhaust channel thermally coupled to the first and the second plurality of memory modules and extending towards the front face over the panel and ending at the first plurality of openings, wherein the first exhaust channel is configured to direct flow of hot air from the first plurality of memory modules to the front face without allowing the hot air to interact with the control circuitry; and a second exhaust channel thermally coupled to the third section and extending towards the front face underneath the panel and ending at the second plurality of openings.

2. The storage unit of claim 1 wherein each of the first and the second plurality of memory modules includes 21 memory modules.

3. The storage unit of claim 1 wherein each of the memory modules comprises:
a printed circuit board (PCB) including one or more memory devices; and
a stiffener member attached to the PCB, wherein a width of the stiffener member is between 5 mm and 6 mm.

4. The storage unit of claim 3 wherein the one or more memory devices include a multi-level cell (MLC) non-volatile memory devices.

5. The storage unit of claim 1 wherein the second exhaust channel is disposed below the first exhaust channel.

6. The storage unit of claim 1 wherein the first exhaust channel includes the panel that provides a physical barrier between the first exhaust channel and the third section.

7. A storage unit comprising:
a first plurality of memory modules disposed side-by-side to each other; and
a second plurality of memory modules disposed side-by-side to each other,
wherein each of the first and second plurality of memory modules includes 21 memory modules and wherein each memory module further comprises:
a memory board including a plurality of memory devices; and
a stiffener attached to the memory board,
wherein the stiffener has a width of between 5 mm and 6 mm and a pitch between two immediately adjacent stiffeners is between 5.5 mm and 6.5 mm.

8. The storage unit of claim 7 further comprising an enclosure that conforms with 1U specification for a rack mountable unit.

9. The storage unit of claim 7 wherein the memory module includes a pair of anchor points for connection with the stiffener.

10. The storage unit of claim 7 further comprising a first exhaust channel configured to exhaust hot air from the first plurality of memory modules and the second plurality of memory modules.

11. The storage unit of claim 10 further comprising:
control circuitry; and
a second exhaust channel configured to exhaust hot air from the control circuitry, wherein the second exhaust channel is disposed directly below the first exhaust channel.

12. The storage unit of claim 11 comprising a solid panel separating the first and the second exhaust channels.

13. A method for manufacturing a high-density solid-state storage unit, the method comprising:
configuring a first section of an enclosure having a front face, a back face opposing the front face, and two side faces to house a first plurality of memory modules;
configuring a second section of the enclosure to house a second plurality of memory modules, wherein the first and the second sections are configured to abut the back face and wherein a third section including control circuitry is configured to abut the front face;
configuring a panel to overly the third section;
configuring the back face to receive a plurality of fans such that the plurality of fans direct air flow towards the front face;
configuring a first plurality of openings in an upper section of the front face to receive a first exhaust channel, the first exhaust channel thermally coupled to the first and the second plurality of memory modules and extending towards the front face over the panel and ending at the first plurality of openings, wherein the first exhaust channel is configured to direct flow of hot air from the first plurality of memory modules to the front face without allowing the hot air to interact with the control circuitry;
configuring a second plurality of opening disposed directly below the first plurality of openings to receive a second exhaust channel thermally coupled to the third section and extending towards the front face underneath the panel and ending at the second plurality of openings.

14. The method of claim 13 wherein configuring each of the first and the second sections of the enclosure comprises configuring each to accept at least 21 memory modules.

15. The method of claim 13 further comprising configuring a stiffener member to attach to a printed circuit board (PCB) of at least one of the first and second plurality of memory modules, wherein a width of the stiffener member is between 5 mm and 6 mm.

16. The method of claim 13 wherein one or more of the first and second plurality of memory modules includes one or more multi-level cell (MLC) non-volatile memory devices.

17. The method of claim 13 further comprising configuring the second exhaust channel to be disposed below the first exhaust channel.

18. The method of claim 13 further comprising configuring the first exhaust channel to include the panel as a physical barrier between the first exhaust channel and the third section.

* * * * *